(12) United States Patent
Uematsu et al.

(10) Patent No.: US 7,294,199 B2
(45) Date of Patent: Nov. 13, 2007

(54) NITRIDE SINGLE CRYSTAL AND PRODUCING METHOD THEREOF

(75) Inventors: Koji Uematsu, Itami (JP); Seiji Nakahata, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 212 days.

(21) Appl. No.: 10/866,007

(22) Filed: Jun. 10, 2004

(65) Prior Publication Data

US 2005/0277214 A1 Dec. 15, 2005

(51) Int. Cl.
*C30B 9/00* (2006.01)
*C30B 29/38* (2006.01)

(52) U.S. Cl. .................. 117/78; 117/79; 117/952; 148/DIG. 113

(58) Field of Classification Search ............ 438/22, 438/481, 492; 117/89, 78, 79, 952; 148/DIG. 113
See application file for complete search history.

(56) References Cited

U.S. PATENT DOCUMENTS

| | | | | |
|---|---|---|---|---|
| 4,196,171 A | * | 4/1980 | Watanabe et al. | 117/209 |
| 4,310,492 A | * | 1/1982 | Nakanishi et al. | 117/209 |
| 4,810,679 A | * | 3/1989 | Dole et al. | 501/98.4 |
| 4,830,800 A | * | 5/1989 | Thomas et al. | 264/662 |
| 4,875,967 A | * | 10/1989 | Mishima et al. | 117/78 |
| 5,063,986 A | * | 11/1991 | Murakami et al. | 164/122.2 |
| 5,067,551 A | * | 11/1991 | Murakami et al. | 164/122.2 |
| 5,186,765 A | * | 2/1993 | Arai et al. | 148/301 |
| 5,603,877 A | * | 2/1997 | Kato et al. | 264/683 |
| 5,716,450 A | * | 2/1998 | Togawa et al. | 117/101 |
| 5,902,542 A | * | 5/1999 | Hirao et al. | 264/639 |
| 6,001,748 A | * | 12/1999 | Tanaka et al. | 438/791 |
| 6,066,205 A | | 5/2000 | Hunter | |
| 6,231,779 B1 | * | 5/2001 | Chiang et al. | 252/62.9 R |
| 6,562,124 B1 | | 5/2003 | Ivantzov et al. | |
| 6,949,140 B2 | * | 9/2005 | Sarayama et al. | 117/81 |
| 2003/0168003 A1 | | 9/2003 | Schowalter et al. | |
| 2003/0211369 A1 | | 11/2003 | Riman et al. | |
| 2006/0048701 A1 | * | 3/2006 | Feigelson et al. | 117/89 |
| 2006/0169197 A1 | * | 8/2006 | Sasaki et al. | 117/2 |

FOREIGN PATENT DOCUMENTS

EP  0711853 A1 * 5/1996

(Continued)

OTHER PUBLICATIONS

JP 57-188500, Nov. 1982 (Abstract).*

(Continued)

*Primary Examiner*—M. Wilczewski
(74) *Attorney, Agent, or Firm*—W. F. Fasse; W. G. Fasse

(57) ABSTRACT

A method of producing a nitride single crystal includes the step of forming a material transport medium layer containing a compound of rare earth element on a surface of a nitride crystal, and the step of making a seed crystal in contact with the material transport medium layer to grow a nitride single crystal on the seed crystal. The material transport medium layer contains the compound of rare earth element and at least one compound selected from a group of aluminum compound, alkaline earth compound and transition metal compound. With this producing method, a large nitride single crystal having a crystal size of at least 10 mm is obtained.

19 Claims, 2 Drawing Sheets

FOREIGN PATENT DOCUMENTS

| | | | |
|---|---|---|---|
| FR | 2796657 | | 1/2001 |
| JP | 57-188500 | * | 11/1982 |
| JP | 58-125700 | * | 7/1983 |
| JP | 60-122797 | | 7/1985 |
| JP | 7-277897 | | 10/1993 |
| JP | 2004-231467 | * | 8/2004 |

OTHER PUBLICATIONS

JP 58-125700, Jul. 1983 (Abstract).*

Motoyuki Tanaka, "Growth of AlN Single Crystal by the Sublimation Method", Journal of Japanese Association for Crystal Growth, Japanese Association for Crystal Growth, vol. 25, No. 4, 1998, pp. 163-166.

Fumio Kawamura et al., "Growth of a Large GaN Single Crystal Using the Liquid Phase Epitaxy (LPE) Technique", Japanese Journal of Applied Phys., Japanese Society of Applied Physics, vol. 42, No. 1A/B, Jan. 15, 2003, pp. L4-L6.

* cited by examiner

NITRIDE SINGLE CRYSTAL AND
PRODUCING METHOD THEREOF

BACKGROUND OF THE INVENTION

1. Field of the Invention

The present invention relates to a nitride single crystal and a producing method thereof, and more particularly to a nitride single crystal and a producing method of the nitride single crystal employing liquid-phase sintering for its growth.

2. Description of the Background Art

Nitride semiconductors such as AlN and $Si_3N_4$ have attracted attention for use as light emitting devices emitting visible or ultraviolet light, and as electronic devices operating at high voltage and large current. Although a material such as sapphire or silicon carbide has been employed for a substrate for producing such an electronic device, it is difficult to form a favorable epitaxial wafer due to large lattice mismatch and a large difference in thermal expansion coefficient between the material and the nitride semiconductor. As such, a nitride substrate ensuring lattice match with the nitride semiconductor has been desired for improvement of properties of the electronic device.

Normally, sublimation, vapor-phase growth or melting is used for growth of a single crystal. It however is difficult to grow a single crystal of nitride such as AlN or $Si_3N_4$ by melting, since the nitride has a low decomposition temperature and requires a high temperature and a high pressure to increase the decomposition temperature higher than a melting temperature. As such, vapor-phase growth or sublimation is used to grow a single crystal of the nitride.

In vapor-phase growth, AlN (g) is generated from the reaction of $2Al\ (s)+2NH_3\ (g) \rightarrow 2AlN\ (g)+3H_2\ (g)$, and is precipitated as a single crystal. It however is difficult to obtain a large single crystal, since Al as the raw material is highly reactive, making it difficult to control the reaction.

Further, in sublimation, for example, aluminum nitride is sublimated and decomposed and then recombined and recrystallized to obtain a single crystal. With this method, again, it is difficult to obtain a large single crystal, since the crystal growth rate at the time of recrystallization is slow (see the article by Motoyuki Tanaka, titled "Growth of AlN Single Crystal by the Sublimation Method", Journal of Japanese Association for Crystal Growth, Japanese Association for Crystal Growth, 1998, Vol. 25, No. 4, pp. 163-166).

On the other hand, in fabrication of polycrystalline aluminum nitride widely used as a heat dissipation substrate for an electronic component, liquid-phase sintering is used to make a small crystal grow larger to thereby improve properties, such as thermal conductivity and others, of the product

SUMMARY OF THE INVENTION

An object of the present invention is to solve the above-described problems and provide a nitride single crystal large in size and a producing method thereof.

To achieve the object, the inventors have completed the present invention by applying liquid-phase sintering, having conventionally been used exclusively for production (sintering) of a polycrystalline nitride, to a producing method of a nitride single crystal.

Specifically, the method of producing a nitride single crystal according to an aspect of the present invention includes forming a material transport medium layer containing a compound of rare earth element on a surface of a nitride crystal, and making a seed crystal in contact with the material transport medium layer to grow a nitride single crystal on the seed crystal. It is preferable that the material transport medium layer contains the compound of rare earth element and at least one compound selected from a group of aluminum compound, alkaline earth compound and transition metal compound, and/or that each of the compounds is an oxide or an oxinitride.

The nitride single crystal according to another aspect of the present invention is obtained by the above-described producing method. With this producing method, a nitride single crystal having a crystal size of at least 10 mm can be obtained.

As described above, according to the present invention, it is possible to form a nitride single crystal of a large crystal size by forming a material transport medium layer containing a compound of rare earth element on a surface of a nitride crystal and by making a seed crystal in contact with the material transport medium layer to grow a nitride single crystal on the seed crystal.

The foregoing and other objects, features, aspects and advantages of the present invention will become more apparent from the following detailed description of the present invention when taken in conjunction with the accompanying drawings.

DESCRIPTION OF THE PREFERRED
EMBODIMENTS

Figure 1:
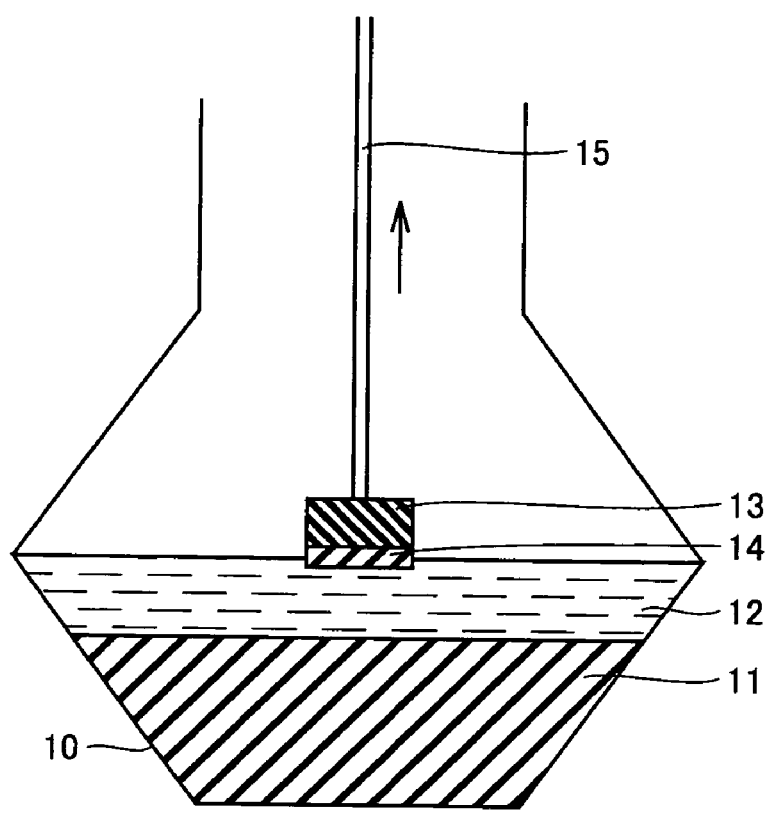
FIG. 1 is a conceptual diagram of a producing method of a nitride single crystal according to the present invention.

Referring to FIG. 1, the producing method of a nitride single crystal according to the present invention includes the step of forming a material transport medium layer 12 containing a compound of rare earth element on a surface of a nitride crystal 11, and the step of making a seed crystal 13 in contact with material transport medium layer 12 to grow a nitride single crystal 14 on seed crystal 13.

Figure 2A:
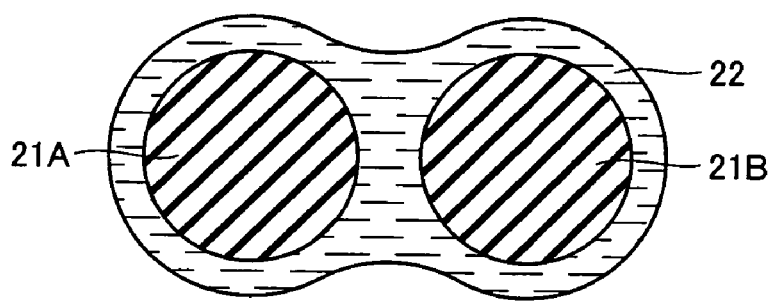
FIGS. 2A and 2B are conceptual diagrams illustrating liquid-phase sintering.
Figure 2B:
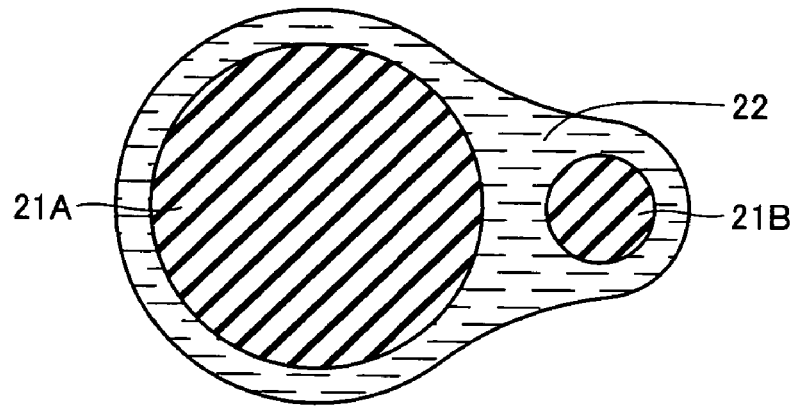

For example, when a mixture of aluminum nitride (AlN) powder as the nitride crystals and yttrium oxide ($Y_2O_3$) powder as the compound of rare earth element is heated to a high temperature, $Y_2O_3$ melts and forms the material transport medium for AlN. More specifically, when the powder of the nitride crystals and the powder containing the compound of rare earth element are mixed and heated to a high temperature, a liquid-phase material transport medium layer 22 containing the rare earth element compound is formed on surfaces of nitride crystals 21A, 21B, as shown in FIG. 2A. The nitride moves from one nitride crystal 21B to the other nitride crystal 21A via material transport medium layer 22 over time, as shown in FIG. 2B, resulting in growth of nitride crystal 21A.

Here, if the other nitride crystal is replaced with a nitride single crystal as a seed crystal and the growth conditions are adjusted, then it is possible to grow a nitride single crystal on the seed crystal. For example, as shown in FIG. 1, nitride crystals 11 and powder containing a compound of rare earth element are introduced into a crucible 10 and heated to form a material transport medium layer 12 on the surfaces of nitride crystals 11. A seed crystal 13 is then pulled, while kept in contact with material transport medium layer 12, so that a nitride single crystal 14 grows on seed crystal 13.

It is noted that the nitride crystal 11 for use as the raw material of nitride single crystal 14 is not limited to the nitride powder. A nitride sintered body, nitride polycrystalline body, or nitride polymorphic body may be used as well. A large nitride single crystal can be obtained using any of these nitride crystals.

The producing method of a nitride single crystal according to the present invention has wide applications, including pulling methods (e.g., Czochralski (CZ) method, liquid encapsulated Czochralski (LEO) method), vertical boat methods (e.g., vertical Bridgman (VB) method), and horizontal boat methods (e.g., horizontal Bridgman (HB) method), as long as the process of making a seed crystal in contact with a material transport medium layer to grow a nitride single crystal on the seed crystal is employed.

Although the mixing ratio of the powder containing a compound of rare earth element with respect to the nitride crystal is not limited specifically, the ratio (powder containing the rare earth element compound/nitride crystal) is preferably from 0.1 to 10 in mass ratio to ensure that the material transport medium layer covers the nitride crystal sufficiently and with high concentration. If the mass ratio is less than 0.1, coverage of the nitride crystal with the material transport medium layer is insufficient. If it exceeds 10, the concentration of the nitride within the material transport medium layer decreases. In either case, the crystal growth rate decreases. Based on the foregoing, the ratio of the powder containing the rare earth element compound to the nitride crystal is more preferably from 0.5 to 5.

Here, the rare earth element is a generic name for 17 elements of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

The temperature for forming the material transport medium layer and growing the nitride single crystal is preferably from 1800° C. to 2800° C. If it is lower than 1800° C., formation of the material transport medium layer of liquid phase is difficult. If it exceeds 2800° C. at a pressure of 1013 hPa, decomposition of the nitride begins. The temperature is more preferably from 1800° C. to 2000° C. from the standpoint of cost reduction.

In the producing method of a nitride single crystal according to the present invention, the material transport medium layer preferably contains a compound of rare earth element, and at least one compound selected from a group consisting of aluminum compound, alkaline earth compound and transition metal compound. Heating the compound such as aluminum compound together with the compound of rare earth element can decrease the temperature for formation of the material transport medium layer and increase the material transport efficiency of the material transport medium layer, and thus, the growth rate of the single crystal also increases.

Although the content ratio of the at least one compound selected from a group of aluminum compound, alkaline earth compound and transition metal compound with respect to the compound of rare earth element is not limited specifically, the ratio (at least one compound selected from the relevant group/compound of rare earth element) is preferably from 0.1 to 10 and more preferably from 0.2 to 2 in mass ratio, from the standpoint of lowering the melting point.

Further, a complex compound of a compound of rare earth element and at least one compound selected from a group of aluminum compound, alkaline earth compound and transition metal compound may also be used suitably. A preferable example thereof is a compound oxide of aluminum oxide ($Al_2O_3$) and yttrium oxide ($Y_2O_3$).

In the producing method of a nitride single crystal according to the present invention, the compound is preferably an oxide or an oxinitride. When the compound is an oxide or an oxinitride, it is readily possible to form a homogeneous material transport medium layer.

The nitride single crystal according to the present invention is obtained with the producing method as described above. With the producing method, it is possible to obtain a large nitride single crystal having a crystal size of at least 10 mm.

Figure 3:
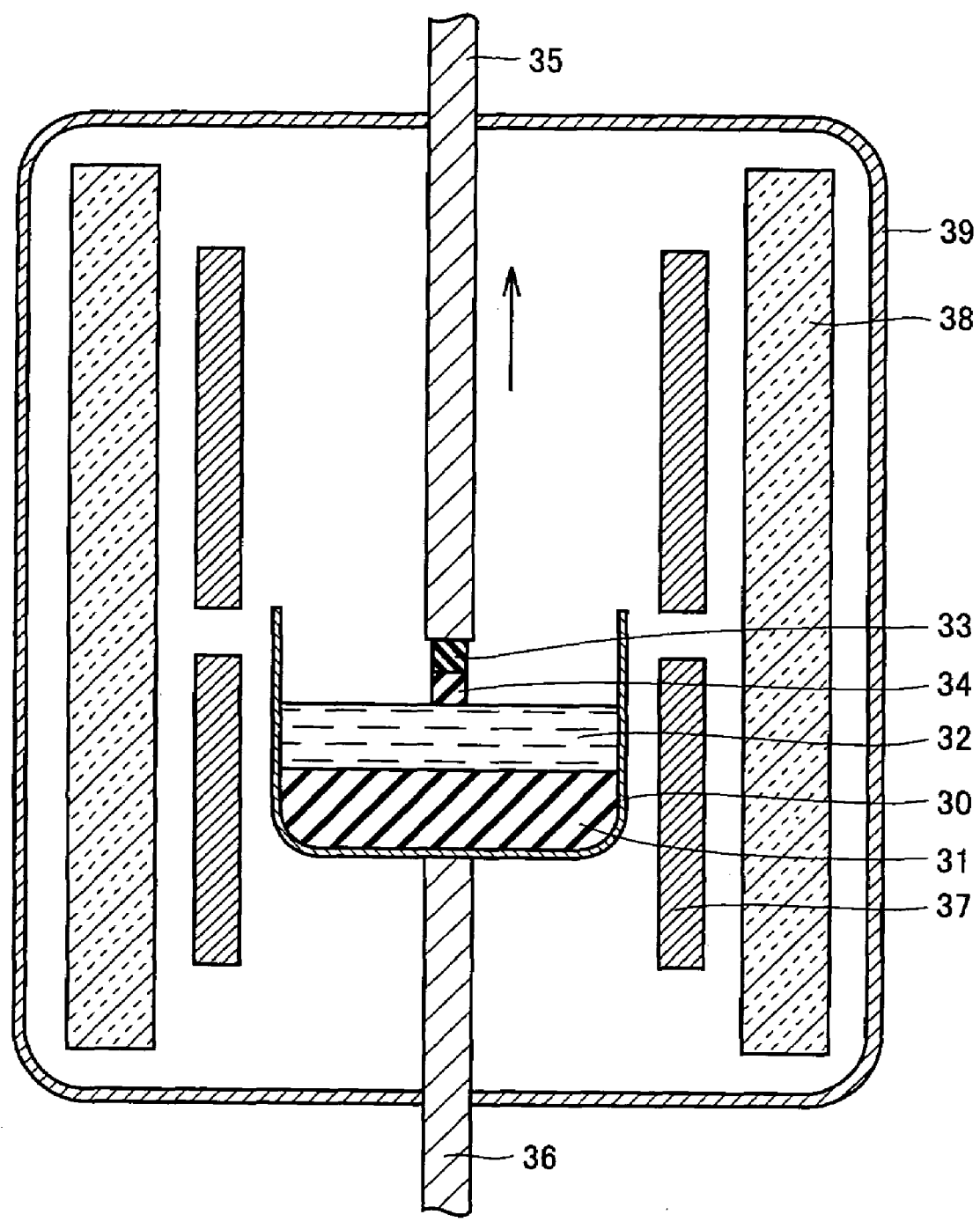
FIG. 3 illustrates an embodiment of the producing method of a nitride single crystal according to the present invention.

A specific example of application of the present invention to the pulling method is now described with reference to FIG. 3. As shown in FIG. 3, the apparatus for producing a nitride single crystal by pulling has a crucible 30, and a heater 37 and a heat insulating material 38 and others surrounding crucible 30, arranged in a stainless container 39. The apparatus further has a pulling shaft 35 for pulling a seed crystal 33 that is kept in contact with a melt (a material transport medium layer 32 in the present invention) within crucible 30.

EXAMPLE 1

AlN powder as nitride crystals 31, in an amount of 1000 g, and $Y_2O_3$ powder as the powder for formation of liquid-phase material transport medium layer 32, in an amount of 1000 g, were mixed and introduced into crucible 30. With the pressure within the apparatus held at 1013 hPa, the temperature was increased to 1900° C. to melt the $Y_2O_3$ powder to thereby form material transport medium layer 32. Thereafter, an AlN single crystal as seed crystal 33 was pulled by 10 mm over 200 hours, while kept in contact with material transport medium layer 32, in synchronization with the growth rate of a product 34 growing on seed crystal 33. X ray diffraction (XRD) was conducted to evaluate product 34 grown on seed crystal 33, and it was found to be an AlN single crystal. The results are shown in Table 1.

EXAMPLES 2-10

For each of Examples 2-10, the ingredients shown in Table 1 including material(s) for forming the material transport medium layer were mixed and heated to the temperature as shown in Table 1, to grow a product 34 on seed crystal 33 in the same manner as in Example 1. X ray diffraction (XRD) was conducted to evaluate product 34 grown on seed crystal 33, and it was found to be an AlN single crystal. The results are shown in Table 1.

TABLE 1

| | | Examples | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 |
| Ingredients Raw materials for formation of material transport medium layer | AlN | 1000 | 1000 | 1000 | 1000 | 1000 | 1000 | 1000 | 1000 | 1000 | 1000 | 1000 | 1000 | 1000 | 1000 |
| | $Y_2O_3$ | 1000 | 1000 | 1000 | | | | | 1000 | 1000 | | 5000 | 500 | 500 | |
| | $Yb_2O_3$ | | | | 1000 | | | | | | | | | | |
| | $Sm_2O_3$ | | | | | 1000 | | | | | | | | | |
| | $Gd_2O_3$ | | | | | | 1000 | | | | | | | | |
| | $Nd_2O_3$ | | | | | | | 1000 | | | | | | | |
| | $Al_2O_3$ | | 300 | 600 | 600 | 600 | 600 | 600 | | | | | 100 | 1000 | 300 |
| | MgO | | | | | | | | 600 | | | | | | |
| | CaO | | | | | | | | | 600 | | | | | |
| | $5Y_2O_3 \cdot 3Al_2O_3$ | | | | | | | | | | 1000 | | | | |
| | YN | | | | | | | | | | | | | | 1000 |
| Crystal growth conditions | Temp. (° C.) | 1900 | 1850 | 1850 | 1850 | 1850 | 1850 | 1850 | 1850 | 1850 | 1850 | 1900 | 1900 | 1850 | 1850 |
| | Pressure (hPa) | 1013 | 1013 | 1013 | 1013 | 1013 | 1013 | 1013 | 1013 | 1013 | 1013 | 1013 | 1013 | 1013 | 1013 |
| | Time (hr) | 200 | 200 | 200 | 200 | 200 | 200 | 200 | 200 | 200 | 200 | 300 | 200 | 200 | 200 |
| Single crystal | Chemical composition | AlN | AlN | AlN | AlN | AlN | AlN | AlN | AlN | AlN | AlN | AlN | AlN | AlN | AlN |
| | Crystal size (mm) | 10 | 15 | 34 | 28 | 53 | 33 | 28 | 22 | 18 | 31 | 10 | 10 | 14 | 14 |

As shown in Table 1, a transparent AlN single crystal having a crystal size of at least 10 mm was obtained using the producing method of a nitride single crystal according to the present invention.

As shown in Examples 1-3, using $Al_2O_3$ together with $Y_2O_3$ as the raw materials for the material transport medium layer can increase the growth rate of the AlN-single crystal, so that a larger single crystal is obtained.

As shown in Example 10, using only a compound oxide of rare earth element and aluminum as the raw material for the material transport medium layer can produce a similar effect as in the case of using the oxide of rare earth element and the oxide of aluminum (Example 3).

Further, as shown in Example 14, when a nitride of rare earth element and an oxide of aluminum are used as the raw materials for the material transport medium layer to form an oxinitride of rare earth element and aluminum, a material transport medium layer of favorable properties is formed, as in the case of forming an oxide of rare earth element and aluminum (Example 2), and thus, a large single crystal is obtained.

As described above, according to the present invention, it is possible to form a nitride single crystal having a large crystal size by forming a material transport medium layer containing a compound of rare earth element on a surface of a nitride crystal, and growing a nitride single crystal on a seed crystal that is kept in contact with the material transport medium layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a nitride single crystal, comprising the steps of:
    forming a liquid-phase material transport medium layer containing a compound of rare earth element on a surface of a nitride source material; and
    making a seed crystal in contact with the liquid-phase material transport medium layer to grow a nitride single crystal on the seed crystal.

2. The method of producing a nitride single crystal according to claim 1, wherein said material transport medium layer contains the compound of rare earth element and at least one compound selected from a group consisting of aluminum compound, alkaline earth compound and transition metal compound.

3. The method of producing a nitride single crystal according to claim 2, wherein each of said compounds is an oxide or an oxynitride.

4. The method of producing a nitride single crystal according to claim 1, wherein said compound is an oxide or an oxynitride.

5. The method of producing a nitride single crystal according to claim 1, wherein the step to grow the nitride single crystal comprises transporting nitride material from the nitride source material through the liquid-phase material transport layer to the seed crystal so as to grow the nitride single crystal of the nitride material on the seed crystal.

6. The method of producing a nitride single crystal according to claim 1, wherein the steps are carried out by performing liquid phase sintering of the compound in contact with the nitride source material.

7. The method of producing a nitride single crystal according to claim 1, wherein said nitride source material is crystalline material.

8. A method of producing a nitride single crystal, comprising the steps:
    a) providing a nitride source material;
    b) providing a liquid-phase material transport medium layer comprising a first compound containing at least one rare earth element, in contact with said nitride source material;
    c) providing a seed crystal in contact with said liquid-phase material transport medium layer;
    d) transporting a nitride material from said nitride source material through said liquid-phase material transport medium layer to said seed crystal; and
    e) growing a nitride single crystal from said nitride material on said seed crystal.

9. The method according to claim 8, wherein said nitride source material comprises at least one solid nitride crystal.

10. The method according to claim 8, wherein said nitride source material comprises a nitride powder mixed in said liquid-phase material transport medium layer.

11. The method according to claim 8, wherein said nitride source material comprises a solid nitride material body selected from a group consisting of a nitride sintered body, a nitride polycrystalline body, and a nitride polymorphic body.

12. The method according to claim 8, wherein a mass ratio of said first compound relative to said nitride source material is in a range from 0.5 to 5.

13. The method according to claim 8, wherein said liquid-phase material transport medium layer further comprises a second compound selected from a group consisting of aluminum compounds, alkaline earth compounds, and transition metal compounds.

14. The method according to claim 13, wherein a mass ratio of said second compound relative to said first compound is in a range from 0.2 to 2.

15. The method according to claim 8, wherein said steps a) and b) comprise sintering a solid phase of said first compound together and in contact with said nitride source material, and melting said first compound to form said liquid-phase material transport medium layer.

16. The method according to claim 8, wherein said step e) is performed in a crystal pulling process.

17. The method according to claim 8, wherein said step e) is performed in a boat process.

18. The method according to claim 8, comprising continuing said step e) until said nitride single crystal has a dimension of at least 10 mm.

19. The method according to claim 8, wherein said nitride source material is a crystalline material.

* * * * *